United States Patent
Schulze

(10) Patent No.: US 8,349,646 B2
(45) Date of Patent: Jan. 8, 2013

(54) SEMICONDUCTOR WAFER FOR SEMICONDUCTOR COMPONENTS AND PRODUCTION METHOD

(75) Inventor: Hans-Joachim Schulze, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 19 days.

(21) Appl. No.: 12/949,332

(22) Filed: Nov. 18, 2010

(65) Prior Publication Data
US 2011/0062558 A1    Mar. 17, 2011

Related U.S. Application Data

(62) Division of application No. 11/844,185, filed on Aug. 23, 2007, now Pat. No. 7,858,501.

(51) Int. Cl.
*H01L 21/322*    (2006.01)
*H01L 21/06*    (2006.01)
(52) U.S. Cl. .......... 438/102; 438/473; 438/471; 257/42; 257/E21.321; 257/E21.318
(58) Field of Classification Search .................. 438/471; 117/2, 3, 13, 19, 20
See application file for complete search history.

(56) References Cited

U.S. PATENT DOCUMENTS

| | | | |
|---|---|---|---|
| 4,033,788 A * | 7/1977 | Hunsperger et al. | 438/167 |
| 4,376,657 A | 3/1983 | Nagasawa et al. | |
| 4,489,480 A | 12/1984 | Martin et al. | |
| 4,548,654 A * | 10/1985 | Tobin | 438/471 |
| 5,436,498 A | 7/1995 | Lesk | |
| 2005/0158969 A1 | 7/2005 | Binns et al. | |

OTHER PUBLICATIONS

Falster, Orthoganal Defect Solutions for Silicon Wafers: MDZ and Micro-Defect Free Crystal Growth, Future Fab International, Issue 12, 2002, 10 pages.

* cited by examiner

*Primary Examiner* — Fernando L Toledo
*Assistant Examiner* — Karen Kusumakar
(74) *Attorney, Agent, or Firm* — Dicke, Billig & Czaja, PLLC

(57) ABSTRACT

A semiconductor wafer for semiconductor components and to a method for its production is disclosed. In one embodiment, the semiconductor wafer includes a front side with an adjoining near-surface active zone as basic material for semiconductor component structures. The rear side of the semiconductor wafer is adjoined by a getter zone for gettering impurity atoms in the semiconductor wafer. The getter zone contains oxygen precipitates. In the near-surface active zone, atoms of doping material are located on lattice vacancies. The atoms of doping material have a higher diffusion coefficient that the oxygen atoms.

13 Claims, 4 Drawing Sheets

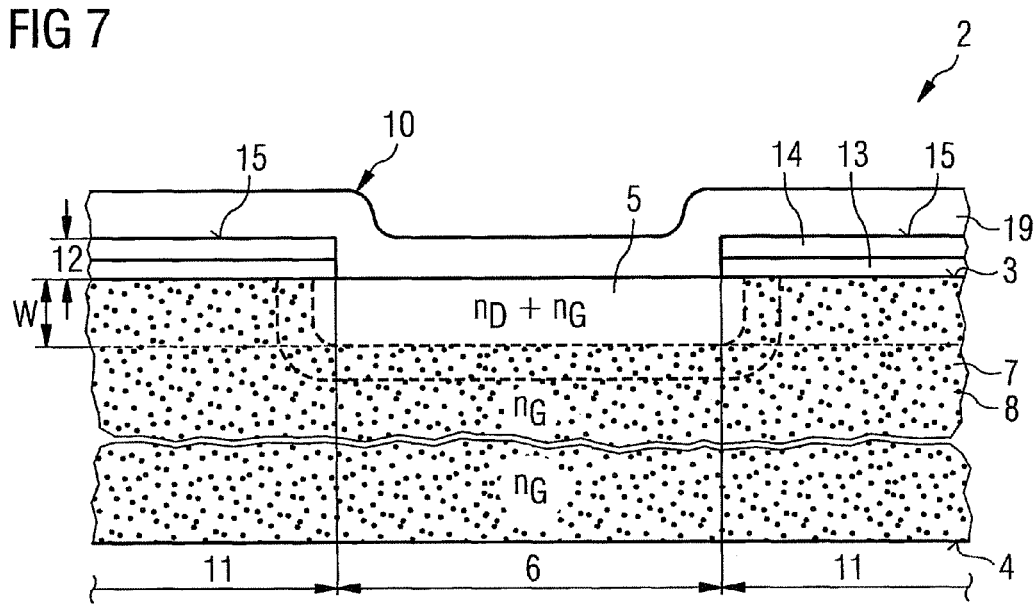

SEMICONDUCTOR WAFER FOR SEMICONDUCTOR COMPONENTS AND PRODUCTION METHOD

CROSS-REFERENCE TO RELATED APPLICATIONS

This Utility Patent Application is a divisional application of U.S. application Ser. No. 11/844,185, filed Aug. 23, 2007, which is incorporated herein by reference.

BACKGROUND

Every year, tons of semiconductor wafers are produced from monocrystalline cylindrical semiconductor ingots by using Czochralski machinery for single-crystalline silicon rods using the Czochralski process. In this process, the melt in the crucible of silicon dioxide is enriched by oxygen atoms, which are then incorporated into the single-crystalline rod as impurities. These oxygen impurities are then present in the semiconductor wafer as well. In the process of producing semiconductor components, a semiconductor wafer of this type is repeatedly heated to high temperatures. This may result in the formation of lattice vacancy agglomerates into which oxygen atoms tend to diffuse to form oxygen precipitates or oxygen deposits at these points.

Such oxygen precipitates offer the advantage that they have a getter effect on the ingress of further foreign atoms in the high-temperature processes involved in the production of semiconductor components, thereby binding foreign atoms. In near-surface areas, however, this effect is undesirable, because oxygen precipitates cause crystal lattice defects in these areas, which may affect the function of the semiconductor component structures. In order to prevent the formation of such oxygen precipitates in a near-surface zone where the semiconductor component structures are to be formed, the oxygen atoms can be diffused out of the near-surface zone of the semiconductor wafer in an inert gas atmosphere.

For this purpose, semiconductor wafers are for example tempered at a diffusion temperature of 1150° C. for up to 20 hours. This generates a near-surface low-oxygen zone, a "denuded zone", out of which oxygen atoms are diffused up to a depth of approximately 10 micrometers. As a result of the lack of oxygen atoms, virtually no oxygen precipitates can form in this low-oxygen zone. The high temperature at which the oxygen atoms are diffused and the long diffusion time, however, are accompanied by an increased risk of contamination and defect formation for the semiconductor wafers.

For these and other reasons there is a need for the present invention.

SUMMARY

One embodiment provides a semiconductor component including a semiconductor wafer and a method for its production. The semiconductor wafer has a front side with an adjoining near-surface active zone as basic material for semiconductor component structures. A rear side of the semiconductor wafer is adjoined by a getter zone for gettering impurities in the semiconductor wafer. The getter zone contains oxygen precipitates. In the active zone near the front side, atoms of doping material are located on lattice vacancies. For this purpose, the atoms of doping material have a higher diffusion coefficient than the oxygen atoms.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 7 is a diagrammatic cross-section through a semiconductor chip position of the semiconductor wafer according to FIG. 6.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
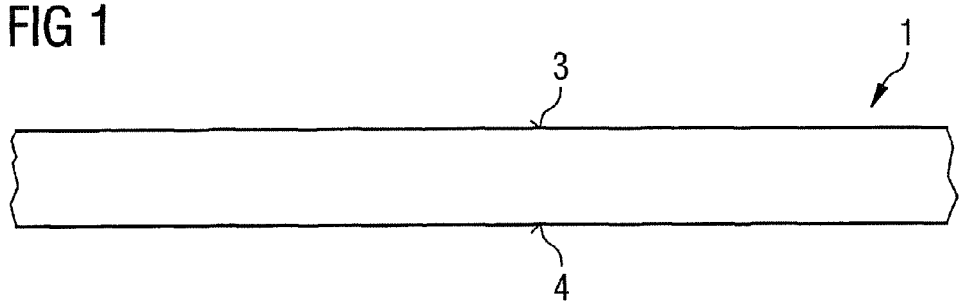
FIG. 1 is a diagrammatic cross-section through a semiconductor wafer produced in a Czochralski process.

FIG. 1 is a diagrammatic cross-section illustrating one embodiment of a semiconductor wafer 1. In one embodiment, the semiconductor wafer 1 was produced in a Czochralski process. The semiconductor wafer 1 consists of monocrystalline silicon, which has inclusions of oxygen atoms in its crystalline structure as a result of the Czochralski process. The semiconductor wafer 1 has a front side 3 and a rear side 4, the front side 3 being highly polished by chemo-mechanical means. Evenly distributed foreign atoms can be incorporated near the surface into the semiconductor wafer 1 from the front side 3.

The semiconductor wafer 1 is further provided with a basic doping already set in the Czochralski process. This basic doping may, for example, include phosphorus or arsenic atoms already introduced into the crystal at a concentration of $10^{14}$ cm$^{-3}$ to $10^{16}$ cm$^{-3}$. These phosphorus or arsenic atoms then make the semiconductor wafer 1 n-conductive. In the subsequent production of a near-surface zone by incorporating atoms of doping material, the latter should in one embodiment not exceed the concentration of the basic doping of the semiconductor wafer 1.

Figure 2:
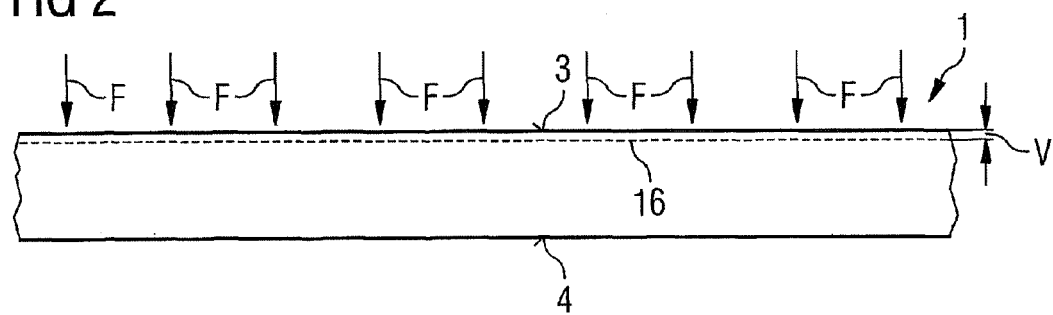
FIG. 2 is a diagrammatic cross-section through the semiconductor wafer according to FIG. 1 during the application of a predoped layer.

FIG. 2 is a diagrammatic cross-section through the semiconductor wafer 1 according to FIG. 1 during and after the application of a predoped layer. The predoped layer may, for example, be introduced into the front side 3 in the direction of arrow F by using ion implantation. The ion-implanted atoms of doping material form a maximum of interstitially and substitutionally incorporated atoms of doping material below the front side 3 at the predoping depth v indicated by a dashed line 16.

Instead of ion implantation, atoms of doping material diffusing faster than oxygen can be introduced into the front side 3 of the semiconductor wafer 1 by applying a predoped layer containing doping material to the semiconductor wafer 1. In one embodiment, this process differs from ion implantation only insofar as the highest concentration in such predoped layers is found at the front side 3 of the semiconductor wafer 1 rather than at the depth v indicated by a dashed line 16 in FIG. 2 as in ion implantation. The concentration of the atoms of doping material is significantly higher than the basic doping of the semiconductor wafer 1 following the predoping process—whether by ion implantation or by using a predoped layer.

Figure 3:
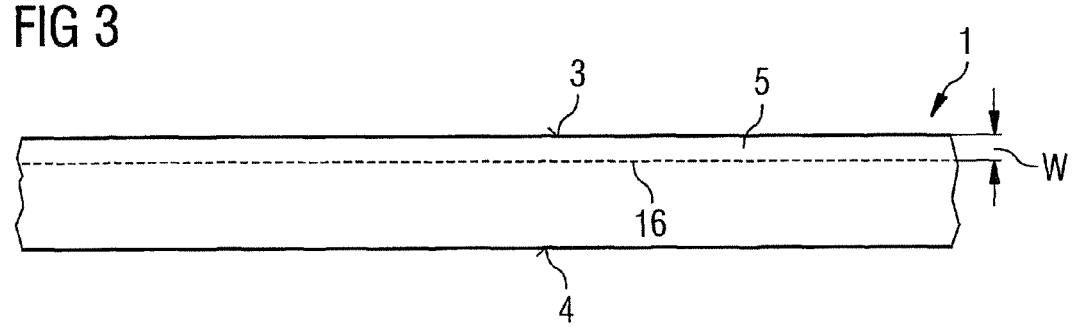
FIG. 3 is a diagrammatic cross-section through the semiconductor wafer according to FIG. 2 after a post-diffusion process.

FIG. 3 is a diagrammatic cross-section through the semiconductor wafer 1 according to FIG. 2 after a post-diffusion process. During this post-diffusion, the atoms of doping material penetrate more deeply into the crystal to a depth w likewise indicated by a dashed line 16. In this process, a near-surface active zone 5 is formed. The concentration of doping material in the active zone 5 has decreased below the concentration of the basic doping as a result of the post-diffusion, so that the conduction type of the basic doping is maintained irrespective of the type of the atoms of doping material (donators or acceptors). Owing to the post-diffusion, the atoms of doping material have occupied a maximum of substitutional lattice positions, i.e. lattice vacancies. As a result, the formation of oxygen deposits in the near-surface active zone 5 in subsequent thermal processes is eliminated to the greatest extent, in particular in view of the fact that the formation of oxygen precipitates requires vacancies or an accumulation or agglomerates of vacancies.

The atoms of doping material should have the required properties, i.e. diffuse faster than oxygen atoms. They should further not act as recombination or generation centres in the semiconductor wafer 1. At least in the case of ion implantation, they should finally be incorporated interstitially to a great extent, while using lattice vacancies after post-diffusion by being introduced substitutionally.

Typical atoms of doping material having the desired properties include selenium or sulphur atoms. Owing to their higher diffusion coefficient, the atoms of doping material can occupy lattice vacancies before these accumulate to form lattice vacancy agglomerates and absorb oxygen atoms while forming oxygen precipitates. Owing to their higher diffusion coefficient, these atoms of doping material can penetrate into near-surface areas of the semiconductor wafer 1 at lower temperatures and occupy lattice vacancies, so that these are no longer available for the formation of oxygen precipitates at any subsequent moderate tempering process in the area of the near-surface active zone 5.

Figure 5:
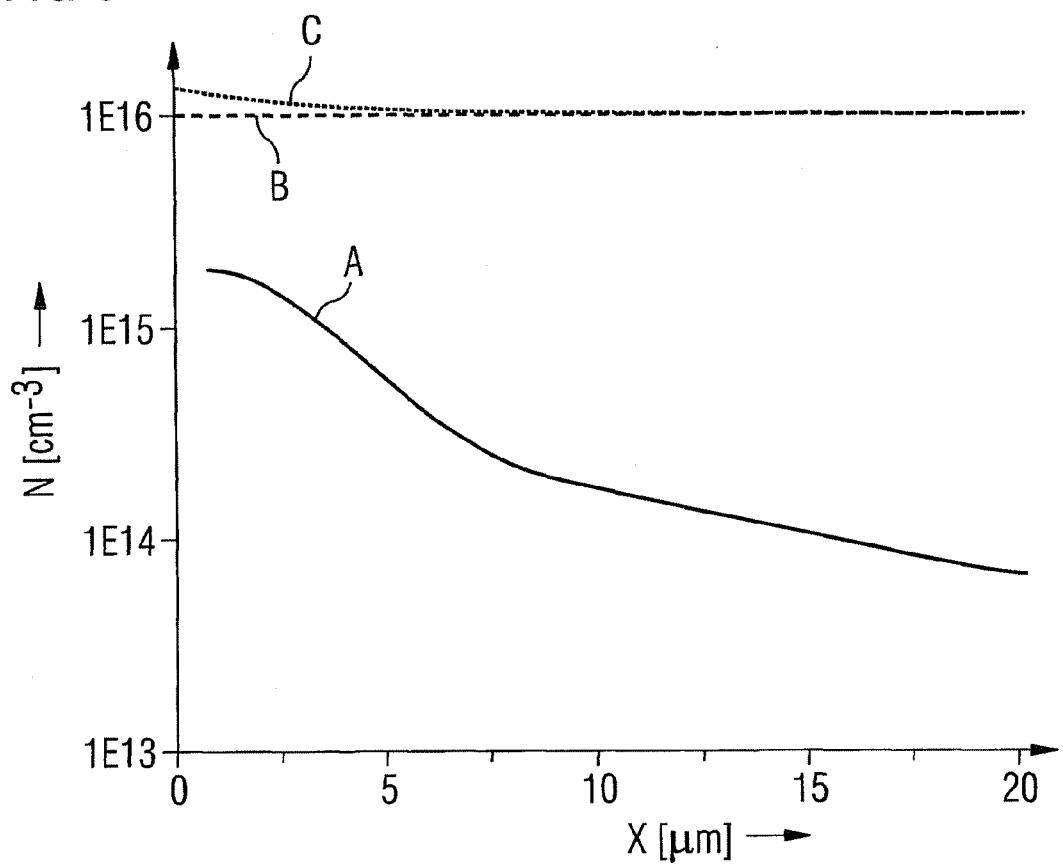
FIG. 5 is a diagram illustrating the development of the concentrations in a near-surface zone of the semiconductor wafer according to FIG. 4.

The vertical dimension, i.e. the depth w, of this active zone 5, which is largely free of oxygen precipitates and which is also referred to as "denuded zone", can be controlled by using a diffusion temperature $T_n$, between 800° C.$\leq T_n \leq$1000° C. during a diffusion time $t_n$ in hours of 0.5 h$\leq t_n \leq$10 h. A typical doping material profile of a selenium-diffused near-surface active zone 5 is illustrated in FIG. 5. If sulphur atoms are used in place of selenium atoms, diffusion depth can be increased considerably, as the diffusion coefficient of the sulphur atoms is higher than the diffusion coefficient of oxygen atoms by nearly a power of ten. In this way, a relatively large vertical dimension of the "denuded zone" can be obtained.

After the introduction of atoms of doping material into the near-surface active zone 5 by diffusion—and thus after the occupation and elimination of lattice vacancies—the whole semiconductor wafer 1 can now be subjected to a tempering process, wherein the formation of oxygen precipitates below the prepared active zone 5 is encouraged with a higher temperature interval. Tempering processes with temperature ramps and/or temperature stages may be provided for this tempering process.

This tempering process can be carried out at temperatures $T_p$ between 850° C.$\leq T_p \leq$1100° C., the post-diffusion time $t_p$ in hours being 5 h$\leq t_p \leq$20 h. This causes a further reduction in the concentration of the atoms of doping material in the near-surface active zone, resulting in an effective penetration depth w of the atoms of doping material in micrometers of w$\geq$10 μm while the concentration of the atoms of doping material decreases to at least 30% below the basic doping of the semiconductor wafer 1.

Figure 4:
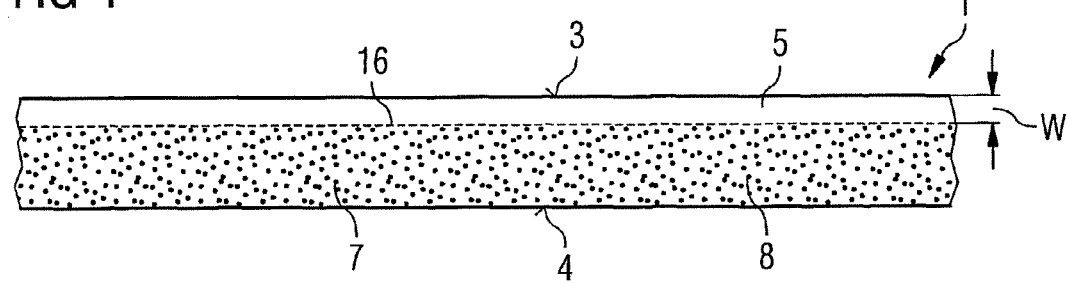
FIG. 4 is a diagrammatic cross-section through the semiconductor wafer according to FIG. 3 after a tempering process.

FIG. 4 is a diagrammatic cross-section through the semiconductor wafer 1 according to FIG. 3 after a tempering process of this type. If the front side is predoped by using ion implantation, the oxygen precipitates 8 are distributed relatively evenly below the near-surface active zone 5 in the getter zone 7 of the semiconductor wafer 1 and extend to the rear side 4 of the semiconductor wafer 1. In the deposition of predoped layers, however, it is often impossible to avoid the formation of a "denuded zone" on the rear side 4 of the semiconductor wafer 1, as predoped layers develop on both sides of the wafer. If this is to be prevented, the rear side 4 of the semiconductor wafer 1 can be masked by a protecting layer before the application of a predoped layer.

In this way, oxygen can be precipitated below the near-surface active zone 5 even at moderate temperatures, which may be lower than those required to diffuse oxygen out. As a result, such semiconductor wafers 1 have, in addition to the virtually precipitate-free near-surface active zone 5 for the incorporation of semiconductor component structures, a getter zone extending to the rear side with an accumulation of oxygen precipitates. The oxygen precipitates ensure that undesirable impurities and/or contamination are kept or removed from the near-surface active zone 5 of the semiconductor wafer 1 and instead collect or accumulate in the lower region of the semiconductor wafer 1. This also improves the reliability of the high-temperature process processes involved in the production of semiconductor components on semiconductor wafers 1.

FIG. 5 is a diagram illustrating the development of the concentrations in a near-surface zone 5 of the semiconductor wafer 1 according to FIG. 4. The penetration depth is illustrated in micrometers on the abscissa in x-direction. On the ordinate, the concentration of doping materials is illustrated in $cm^{-3}$ in a logarithmic scale. The diagram illustrates three curves A, B and C indicating developments of concentration. Curve B represented by a dashed line illustrates basic doping, which in the illustrated embodiment of the invention is approximately $1 \times 10^{16}$ $cm^{-3}$ and is virtually constant.

The post-diffusion of atoms of doping material at relatively low temperatures compared to the usual temperatures required for diffusing oxygen atoms out of the crystal results in a concentration profile of the diffused atoms of doping material which is represented by curve A drawn in a continuous line. The maximum concentration is approximately $2 \times 10^{15}$ cm$^{-3}$ and therefore significantly lower than that of the basic doping indicated by curve B. If the two concentration values are added, the result is curve C, which is represented by a dotted line. Curve C illustrates the overall profile of the concentration of doping material in the near-surface area, which in the logarithmic scale only slightly deviates from curve B representing basic doping.

Figure 6:
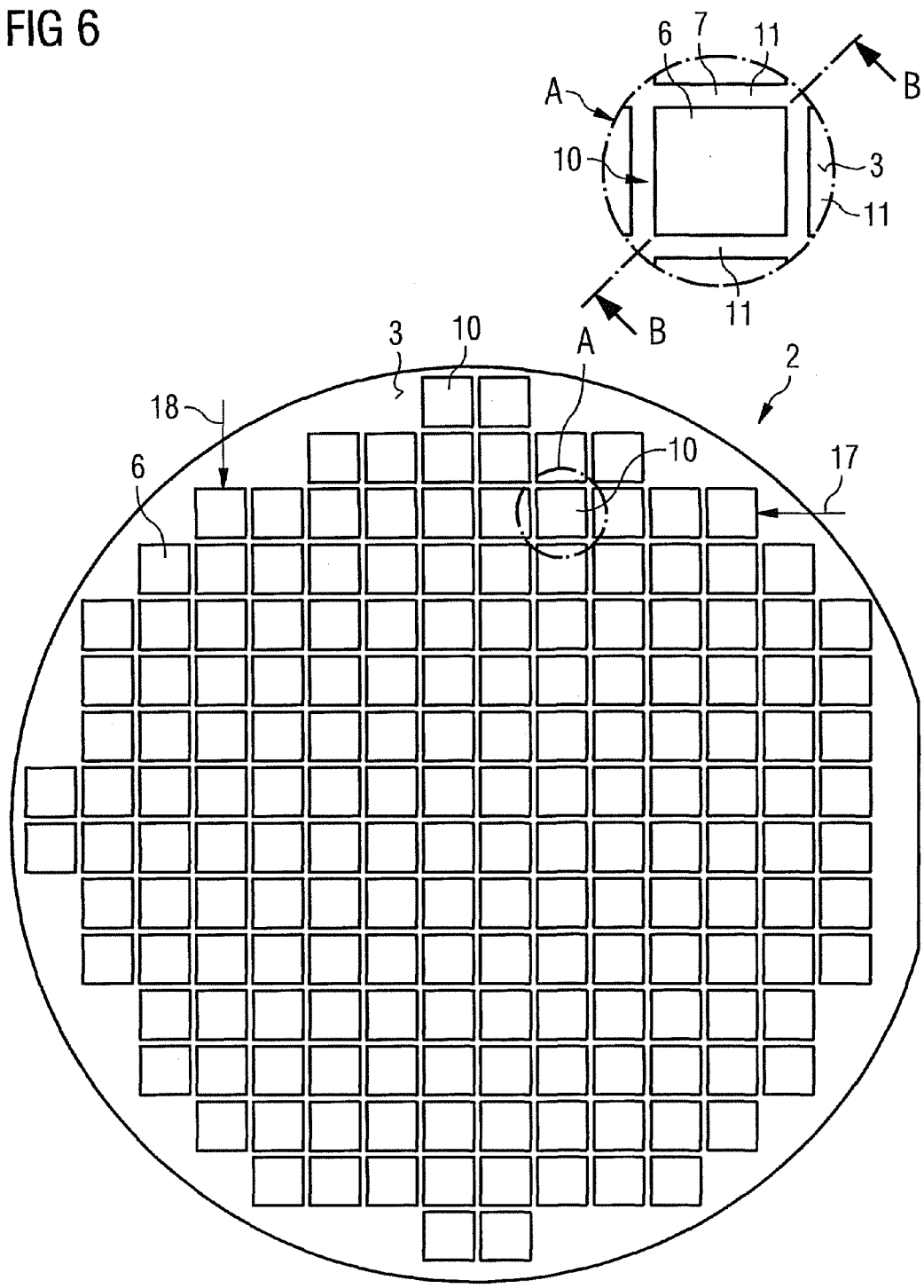
FIG. 6 is a diagrammatic top view of one further embodiment of a semiconductor wafer.

FIG. 6 is a diagrammatic top view of a further embodiment of the semiconductor wafer 2 according to the invention. On the semiconductor wafer 2, semiconductor chip positions 10 are arranged in rows 17 and columns 18. An enlarged section A illustrates one of the semiconductor chip positions 10 in detail. The semiconductor chip position has edge areas 11 with getter zones 7 with oxygen precipitates from the rear side to the front side 3 of the semiconductor wafer 2 for gettering impurity atoms.

In addition, the enlarged section A of the semiconductor chip position 10 illustrates a central active area 6 of a near-surface active zone as a basic material for semiconductor component structures. The active zone includes doping materials with a higher diffusion coefficient than oxygen atoms, which are located on lattice vacancies. As a result, as has been explained above, the central active area 6 of a semiconductor chip position 10 remains free of oxygen precipitates. The edge areas 11 completely surround this central active area 6 both at the edges and at the bottom and have a getter effect on foreign atoms and impurities. The edge area 6 therefore has a getter effect on the central active area 6. This improves the semiconductor characteristics of this central active area 6 in each semiconductor chip position 10, which is designed for semiconductor component structures.

As explained above, the oxygen precipitates are located below the near-surface active zones of the active areas 6 illustrated in FIG. 6 on lattice vacancy agglomerates. In contrast, the atoms of doping material are located within the near-surface active zone on substitutional lattice positions of the monocrystalline semiconductor wafer 2 in the central active area 6. In this second embodiment of the invention, too, a concentration of atoms of doping material is maintained which is at least 30% lower than the basic concentration of atoms of doping material of the semiconductor wafer 2. The diffusion coefficients of the atoms of doping material, however, are higher than those of the oxygen atoms by at least a factor of 2. For this reason, selenium or sulphur is used as atoms of doping material.

A method for the production of a semiconductor wafer 2 of this type, however, differs from the method for the production of a semiconductor wafer 1 according to FIGS. 1 to 4.

FIG. 7 is a diagrammatic cross-section through a semiconductor chip position 10 of the semiconductor wafer 2 according to FIG. 6 along line B of section A. In this case, the semiconductor wafer 2 is protected by a protecting oxide layer 19, which may, for example, develop in the post-diffusion process. The cross-section according to FIG. 7 further illustrates a structured oxide layer 13 and a structured nitride layer 14 located thereon, which protect the edges during the introduction of atoms of doping material into the central active area 6.

In the semiconductor body below the central active area 6, an active zone 5 generated by the introduction of atoms of doping material extends to a depth w of up to 20 μm or an even greater depth (for example 50 μm). The active zone 5 contains charge carriers $n_G$ of the basic doping of the semiconductor wafer 2, which are for example already incorporated in the Czochralski process. Additional charge carriers $n_D$ are added by a post-diffusion of atoms of doping material, if these produce the same conduction type as the basic doping. The basic doping $n_G$ is increased only slightly by the additional charge carriers or—in the case of doping materials of a conduction type opposite to that of the basic doping—reduced slightly, as the concentration of doping material is at least 30% lower than that of the basic doping.

The central near-surface active zone 5 is surrounded by a semiconductor material with oxygen precipitates 8 both in the edge area of the central active zone and below the central active zone 5. In these areas the basic doping predominates, resulting in a charge carrier concentration $n_G$. In addition, however, there is a high concentration of oxygen atoms, which form in areas of vacancy agglomerates during a tempering process and at temperatures which are slightly higher than those used in the introduction of the concentration of doping material.

A method for the production of a semiconductor wafer 2 with such semiconductor chip positions 10 therefore includes the following process processes. First, a structured protecting layer is applied to edge areas of semiconductor chip positions on the front side 3 of the semiconductor wafer 2, leaving central active areas 6 of the semiconductor chip positions 10. The structured protecting layer leaves the central active area 6 exposed.

Atoms of doping material diffusing faster than oxygen are then introduced into or applied to the exposed central active areas 6 of the front side 3 of the semiconductor wafer 2. This is followed by a post-diffusion of the introduced or applied atoms of doping material in the semiconductor wafer 2 in an inert or oxidising atmosphere. This process results in a concentration profile for impurity atoms which is indicated in FIG. 5 by curve A. The semiconductor wafer 2 is then tempered accompanied by the formation of oxygen precipitates 8 in the edge areas of the semiconductor chip positions 10 and below the central active zones 5 of the semiconductor chip positions 10. In this way, the active zones 5 are completely surrounded by semiconductor material with oxygen precipitates 8, which have a getter effect on any impurities which may be introduced in subsequent high-temperature processes.

Instead of the structured protecting layer illustrated in FIG. 7, which includes a structured silicon oxide layer 13 and a structured silicon nitride layer 14 placed on top thereof, a photoresist structure can be applied in a photolithography process to form a structured protecting layer 12. Such photoresist structures may protect against the ingress of ion implants in the ion implantation process. The photoresist structure is removed after ion implantation and before post-diffusion, as it is not suitable for high-temperature processes.

In order to produce a structure as illustrated in FIG. 7 on the semiconductor wafer 2 in the semiconductor chip positions 10, the semiconductor wafer 2 is first thermally oxidised to produce an oxide layer 13 and/or provided with a silicon nitride layer 14. A photoresist structure is then applied to the front side 15 of the oxide layer 13 or the silicon nitride layer 14 in a photolithography process; this, too, has to be removed before post-diffusion. As long as this photoresist structure is present, the oxide layer 13 or the silicon nitride layer 14 or both can be etched to produce the structure illustrated in FIG. 7, using a plasma etching and/or a wet etching method.

The application of predoped layers by using ion implantation or by using depositing suitable layers containing the atoms of doping material is carried out in the same way as in the methods described above. Post-diffusion temperatures and diffusion times are also set to obtain a depth w for the near-surface active zone 5. This can be followed by tempering to form oxygen precipitates as described above, using suitable temperatures and times.

Prior to any further process processes for the production of semiconductor component structures in the active zones of the semiconductor wafer 2, the coating illustrated in FIG. 7 on the front side 3 of the semiconductor wafer 2 can be removed completely if required.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor wafer comprising:
   a front side with an adjoining near-surface active zone as a basic material for semiconductor component structures;
   a rear side with an adjoining getter zone for gettering impurity atoms;
   the getter zone containing oxygen precipitates; and
   atoms of doping material being located on lattice vacancies in the near-surface active zone, the atoms of doping material having a higher diffusion coefficient than oxygen atoms in the semiconductor wafer.

2. The semiconductor wafer of claim 1, wherein the atoms of doping material are located on substitutional lattice positions of the semiconductor wafer.

3. The semiconductor wafer of claim 1, wherein the oxygen precipitates are located in lattice vacancy agglomerates.

4. The semiconductor wafer of claim 1, wherein a concentration of the atoms of doping material is at least 30% lower than a basic concentration of doping material of the semiconductor wafer.

5. The semiconductor wafer of claim 1, wherein the diffusion coefficient of the atoms of doping material is higher than the diffusion coefficient of the oxygen atoms by at least a factor of two.

6. The semiconductor wafer of claim 1, wherein the atoms of doping material form the same conduction type as the doping material of the basic doping.

7. The semiconductor wafer of claim 1, wherein the atoms of doping material form a conduction type complementing the basic doping of the semiconductor wafer.

8. The semiconductor wafer of claim 1, wherein the atoms of doping material comprise selenium.

9. The semiconductor wafer of claim 1, wherein the atoms of doping material comprise sulphur.

10. A semiconductor wafer comprising:
    semiconductor chip positions with edge areas and central active areas, the semiconductor chip positions comprising:
    in the edge areas getter zones with oxygen precipitates extending from the rear side to the front side of the semiconductor wafer for gettering impurity atoms; and
    in each central active area a near-surface active zone as basic material for semiconductor component structures, the active zone containing atoms of doping material with a higher diffusion coefficient than oxygen atoms, which are located on lattice vacancies.

11. The semiconductor wafer of claim 10, wherein the oxygen precipitates are located in lattice vacancy agglomerates.

12. The semiconductor wafer of claim 10, wherein the atoms of doping material are located on substitutional lattice positions of the monocrystalline semiconductor wafer.

13. The semiconductor wafer of claim 12, wherein the concentration of the atoms of doping material is at least 30% lower than the basic concentration of doping material of the semiconductor wafer.

* * * * *